(12) United States Patent
Gunderson

(10) Patent No.: US 9,078,357 B2
(45) Date of Patent: Jul. 7, 2015

(54) INTERNAL COVER THERMAL CONDUCTION

(75) Inventor: Neal Frank Gunderson, Lake Elmo, MN (US)

(73) Assignee: Seagate Technology LLC, Cupertino, CA (US)

(*) Notice: Subject to any disclaimer, the term of this patent is extended or adjusted under 35 U.S.C. 154(b) by 660 days.

(21) Appl. No.: 13/467,619

(22) Filed: May 9, 2012

(65) Prior Publication Data

US 2012/0281361 A1  Nov. 8, 2012

Related U.S. Application Data

(63) Continuation-in-part of application No. 12/542,502, filed on Aug. 17, 2009, now Pat. No. 8,199,506.

(51) Int. Cl.
*H05K 7/20* (2006.01)
*H05K 5/02* (2006.01)

(52) U.S. Cl.
CPC ......... *H05K 5/0256* (2013.01); *Y10T 29/49826* (2015.01); *H05K 5/0269* (2013.01); *H05K 7/20472* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,730,232 | A * | 3/1988 | Lindberg | 361/688 |
| 5,596,486 | A * | 1/1997 | Young et al. | 361/737 |
| 6,011,690 | A | 1/2000 | Hughes | |
| 6,188,576 | B1 * | 2/2001 | Ali et al. | 361/704 |
| 6,246,582 | B1 * | 6/2001 | Habing et al. | 361/704 |
| 6,252,776 | B1 | 6/2001 | Salto | |
| 6,353,538 | B1 | 3/2002 | Ali | |
| 6,465,728 | B1 * | 10/2002 | McLaughlin et al. | 174/16.3 |
| 6,653,730 | B2 | 11/2003 | Chrysler | |
| 6,940,721 | B2 | 9/2005 | Hill | |
| 7,023,699 | B2 | 4/2006 | Glovatsky | |
| 7,230,831 | B2 | 6/2007 | Lockner | |
| 7,347,354 | B2 | 3/2008 | Hurley | |
| 7,438,558 | B1 | 10/2008 | Sinha | |
| 7,800,065 | B2 | 9/2010 | Konkle | |
| 7,944,703 | B2 * | 5/2011 | Ni et al. | 361/752 |
| 8,034,602 | B2 | 10/2011 | Park | |
| 8,879,263 | B2 * | 11/2014 | Gunderson | 361/708 |
| 2011/0038123 | A1 | 2/2011 | Janik | |

* cited by examiner

*Primary Examiner* — Gregory Thompson
(74) *Attorney, Agent, or Firm* — Hall Estill Attorneys at Law

(57) ABSTRACT

An apparatus and associated methodology associated with a thermally conductive frame having a perimeter surface defining a passage. A printed circuit board assembly (PCBA) is operably disposed within the passage and connected to the frame. The PCBA includes a solid state memory component. An internal cover is disposed in the passage on one side of the PCBA. The internal cover conducts heat to the frame that is operably generated by the solid state memory component. An external cover is attachable to the frame on an opposing side of the PCBA. The external cover cooperates with the frame and the internal cover to enclose the PCBA.

20 Claims, 8 Drawing Sheets

INTERNAL COVER THERMAL CONDUCTION

RELATED APPLICATION

This is a continuation-in-part application claiming the benefit of the earlier filing date of U.S. patent application Ser. No. 12/542,502.

FIELD

The present embodiments relate generally to data storage, and more particularly, a solid state data storage assembly.

SUMMARY

Some embodiments of the present invention contemplate an apparatus having a thermally conductive frame with a perimeter surface defining a passage. A printed circuit board assembly (PCBA) is operably disposed within the passage and connected to the frame. The PCBA includes a solid state memory component. An internal cover is disposed in the passage on one side of the PCBA. The internal cover conducts heat to the frame that is operably generated by the solid state memory component. An external cover is attachable to the frame on an opposing side of the PCBA. The external cover cooperates with the frame and the internal cover to enclose the PCBA.

Some embodiments of the present invention contemplate a method including steps of: obtaining a thermally conductive frame having a perimeter surface defining a passage; positioning a conductive internal cover in the passage; positioning a PCBA in the passage, the PCBA including a solid state memory component; and attaching an external cover to the frame, thereby urging the solid state memory component in contact against a compressible layer of the internal cover and urging a rigid layer of the internal cover in contact against the frame, establishing a conductive path via the internal cover for transferring heat to the frame that is operably generated by the solid state memory component.

Some embodiments of the present invention contemplate a data storage device having an enclosure constructed of opposing external sides that are spatially separated by a peripheral edge defining a cavity. A PCBA is mounted in the cavity substantially parallel to the external sides and defining a dead air space in the cavity between the PCBA and at least one of the external sides. Means are provided for conducting heat from the dead air space to the peripheral edge of the enclosure.

DETAILED DESCRIPTION

Initially, it is to be appreciated that this disclosure is by way of example only, not by limitation. The heat transfer concepts herein are not limited to use or application with any specific system or method for using storage element devices. Thus, although the instrumentalities described herein are for the convenience of explanation, shown and described with respect to exemplary embodiments, it will be appreciated that the principles herein may be applied equally in other types of storage element systems and methods involving the storage and retrieval of data.

Solid state data storage is an advancing technology for data storage applications. Solid state data storage devices differ from non-solid state devices in that they typically have no moving parts and include memory chips to store data. Examples of solid state memory components used for solid state data storage include flash memory and magnetic random access memory (MRAM).

Figure 1:
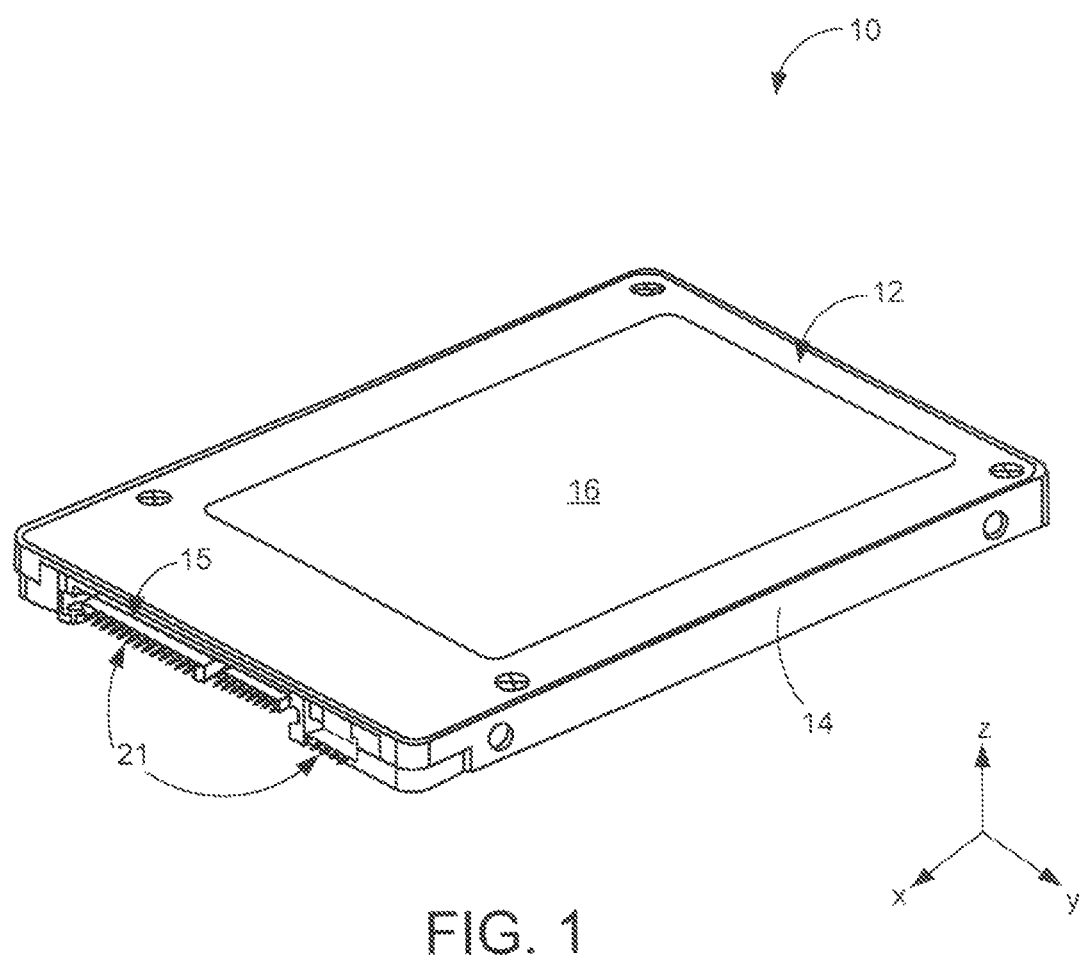
FIG. 1 is a perspective depiction of a solid state data storage assembly.

FIG. 1 is a perspective view of an example solid state data storage assembly 10, which can be a non-volatile data storage assembly. Solid state data storage assembly 10 may also be referred to as a solid-state drive. Data storage assembly 10 is suitable for use in various applications, such as computing devices, portable electronic devices or other devices that store data. Solid state data storage assembly 10 differs from non-solid state devices, such as disc drives, in that solid state data storage assembly 10 typically does not have moving parts.

Data storage assembly 10 includes outer housing 12, which is defined by frame 14, first cover 16, and a second cover 18 (shown in FIG. 2), where first and second covers 16, 18 are mechanically coupled to opposite sides of frame 12 to define a space within which electrical components of data storage assembly 10 are enclosed. Covers 16, 18 can be mechanically connected to housing 12 using any suitable technique, such as using one or more screws, connection fingers, locking/clipping structures, adhesives, rivets, other mechanical fasteners, welding (e.g., ultrasonic welding) or combinations thereof. Housing 12 may be formed from any suitable material, such as metal (e.g., aluminum), plastic, or other suitable material or combinations thereof. Housing 12 substantially encloses at least one printed circuit board assembly ("PCBA," not shown in FIG. 1), which includes electrical components, such as memory components (e.g., flash memory, magnetic random access memory (MRAM), static random access memory (SRAM) or dynamic random access memory (DRAM) chips) that store data and one or more controllers.

Figure 2:
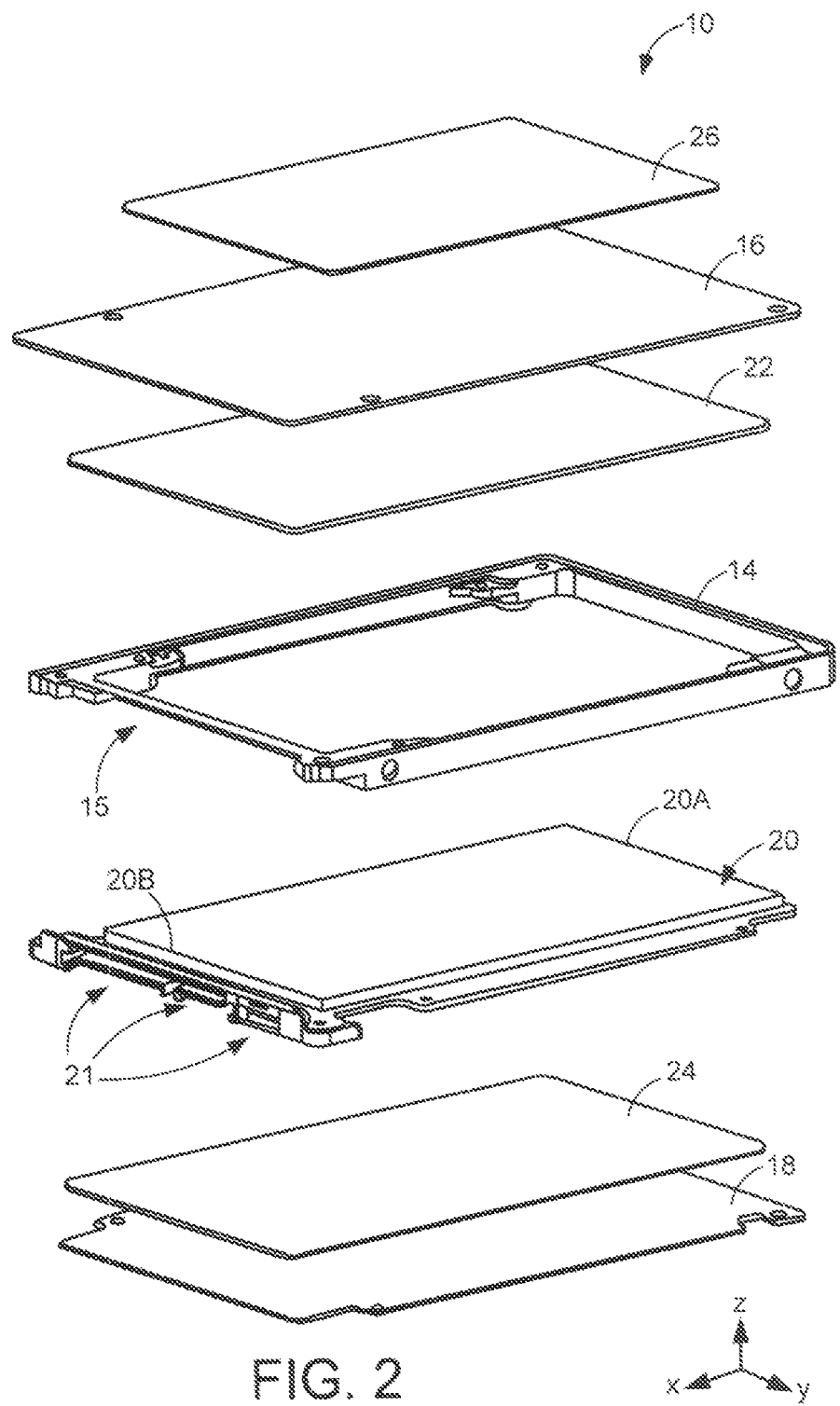
FIG. 2 is an exploded perspective depiction of the solid state data storage assembly of FIG. 1 constructed in accordance with embodiments of the present invention.

FIG. 2 is an exploded perspective view of data storage assembly 10. The example data storage assembly 10 shown in FIGS. 1 and 2 includes frame 14, first cover 16, second cover 18, PCBA 20, thermal interfaces 22, 24, and label 26. Label 26 may indicate the parameters of data storage assembly 10, e.g., the memory capacity. In other examples, data storage assembly 10 does not include label 26 or may include more than one label.

Figure 3:
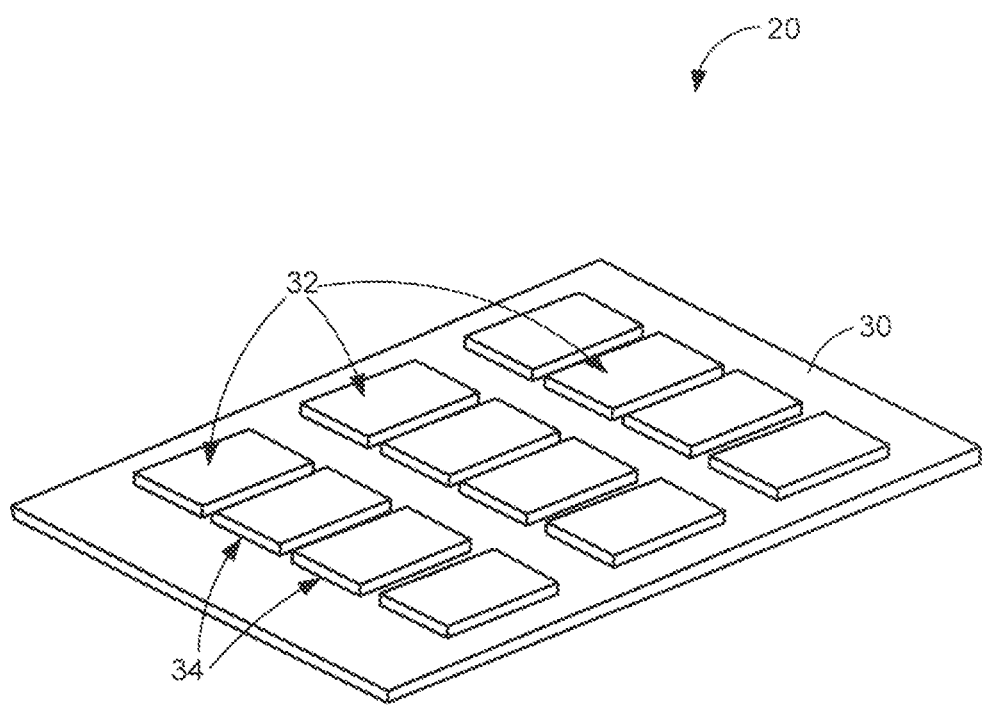
FIG. 3 is a perspective depiction of an example printed circuit board assembly of the solid state data storage assembly of FIG. 1.

As shown in FIG. 3, which is a schematic illustration of an example PCBA 20, PCBA 20 can include printed circuit board 30 and electrical components 32. Electrical components 32 include components such as one or more controller chips (e.g., controller integrated circuits) that control the storage and retrieval of data by data storage assembly 10, one or more memory chips (e.g., flash memory, MRAM, SRAM or DRAM chips), one or more passive electrical components (e.g., capacitors or resistors), and the like. Electrical components 32 are electrically and mechanically coupled to printed circuit board 30 using any suitable technique, such as using solder joints or connector pins that are positioned between electrical contacts of electrical components 32 and electrical contacts on printed circuit board 30. In the example shown in FIG. 3, electrical components 32 are soldered onto printed circuit board 20 using a surface mount technology process. As a result, solder joints 34 are formed between each electrical component 32 and printed circuit board 30.

PCBA 20 may include electrical contacts that electrically connect to a plurality of input/output connectors 21, which are each configured to provide as an interface with one or more host device (e.g., a computer, a consumer electronic device, etc.). For example, input/output connectors 21 can be configured to transmit data, power and control signals to and from a host device. Example input/output connectors 21 can, but need not include a service expansion shelf (SES) connector, a serial advanced technology attachment (SATA) connector, and/or a four pin test connector. Frame 14 of housing 12 defines opening 15 through which input/output connectors 21 may be accessed. PCBA 20 can also be electrically connected to additional connectors such as, but not limited to, a pin connector (e.g., a J1 connector, which is a 110-pin connector). The additional connectors may be positioned on any suitable side of PCBA 20, such as side 20A substantially opposite side 20B on which connector 21 is positioned.

Printed circuit board 30 may include electrical components on more than one side. Thus, although electrical components 32 are shown on a single side of printed circuit board 30 in the example shown in FIG. 3, in other examples, electrical components 32 may be positioned on more than one side of printed circuit board 30 (e.g., on opposite sides of printed circuit board 30). In addition, although one PCBA 20 is shown in FIG. 2, in other examples, data storage assembly 10 may include any suitable number of PCBAs, such as two, three or more. If data storage assembly 10 includes a plurality of PCBAs, the PCBAs may be stacked in a z-axis direction (orthogonal x-y-z axes are shown in FIGS. 1 and 2), stacked in the x-y plane or any combination thereof.

During operation of data storage assembly 10, heat may be generated by electrical components 32 of PCBA 20. The generation of heat from the operation of data storage assembly 10 may be especially compounded when a plurality of data storage assemblies 10 are positioned next to each other, e.g., in a device or in a server room or other data center. As heat builds up within housing 12 (FIG. 1), the performance of data storage assembly 10 may degrade and the useful life of electrical components 32 may decrease due to the added stress on components 32 from the relatively high temperature operating environment.

The issue of heat build-up becomes particularly pronounced when housing 12 substantially encloses PCBA 20, e.g., as shown in FIGS. 1 and 2, due to limited air circulation within housing 12 as well as the relative small size of housing 12. While one or both covers 16, 18 may be removed from data storage assembly 10 in order to help improve the heat conduction of data storage assembly 10, covers 16, 18 serve various purposes in assembly 10. As a result, other issues may arise as a result of removing one or both covers 16, 18 from assembly 10. For example, covers 16, 18 provide shock protection to assembly 10 by increasing the stiffness of assembly 10. In addition, covers 16, 18 helps protect PCBA 20 and its electrical components 32 from environmental contaminants, such as dust particles, liquids, and the like. Thus, it may be undesirable to remove covers 16, 18 from housing 12 in some instances. The present embodiments leverage the use the covers 16, 18 as large "single fin" heat sinks by constructing highly thermal conductive paths for heat transfer to some or all of the components mounted to the printed circuit board, which are otherwise thermally insulated from the covers 16, 18 by being mounted to the printed circuit board.

In order to help improve the heat conduction data storage assembly 10, data storage assembly 10 includes thermal interface 22 positioned between PCBA 20 and cover 16, and thermal interface 24 positioned between PCBA 20 and cover 18. Thermal interfaces 22, 24 contact different sides of printed circuit board assembly 20. In contrast to thermally insulating material, thermal interfaces 22, 24 each comprise a thermally conductive material, which aids in the conduction of heat away from electrical components 32 of PCBA 20 and improves the thermal transfer efficiency of data storage assembly 10. In some examples, thermal interfaces 22, 24 exhibit a thermally conductivity of about 0.1 watts per meter-Kelvin (W/mK) to about 3.0 W/mK, although other thermal conductivities are contemplated. The conduction of heat away from components 32 can help maintain the operational integrity of electrical components 32 and increase the useful life of data storage assembly 10 by decreasing the stress on components 32 that is generated from relatively high operating temperatures. In some examples, thermal interfaces 22, 24 may each comprise a ceramic filled silicone elastomer. However, other thermally conductive materials may also be used to form thermal interfaces 22, 24.

In some examples, thermal interfaces 22, 24 are formed of a substantially mechanically conformable material, such that thermal interfaces 22, 24 are capable of substantially conforming to the topography of PCBA 20. In such examples, when thermal interfaces 22, 24 are positioned over PCBA 20 and compressed, thermal interfaces 22, 24 may contact one or more surfaces of PCBA 20 (e.g., the surface of electrical components 32). Increasing the contact between thermal interfaces 22, 24 and PCBA 20 with a conformable material may be desirable in order to increase the conduction of heat away from electrical components 32. Furthermore, some of the heat generated by the electrical components 32 is directed toward and into the printed circuit board 30, potentially creating a hot spot in the area of the printed circuit board 30 where the electrical component 32 is mounted. The conformable material compressingly engaged against the PCBA 20 likewise conducts heat away from any such hot spot.

In addition to or instead of being formed from a substantially conformable material, thermal interfaces 22, 24 may each define a plurality of openings (e.g., cutaway portions) that are configured to receive surface protrusions of PCBA 20. The surface protrusions may be formed by the placement of electrical components 32 on printed circuit board 30 and extending from printed circuit board 30. In this way, thermal interfaces 22, 24 may better envelop electrical components 32 and increase the surface area for contacting electrical components 32 and conducting heat away from electrical components 32.

Thermal interfaces 22, 24 are each formed from one or more layers of thermally conductive material, which may be substantially continuous in order to define a path of low thermal resistance. In some examples, thermal interfaces 22, 24 each comprise multiple layers of material that may be stacked in a z-axis direction or multiple layers of material that are positioned adjacent each other in the x-y plane.

In the example of data storage assembly 10 shown in FIG. 2, thermal interfaces 22, 24 each define a structure having a stiffness that enables thermal interfaces 22, 24 to be removed from housing 12 while maintaining their structural integrity. For example, thermal interfaces 22, 24 may each be configured such that they may be removed from housing 12 without breaking apart or decomposing upon handling. As a result, thermal interfaces 22, 24 may easily be introduced into and removed from housing 12 without generating particles or other contaminants that may affect the operation of data storage assembly 10.

Configuring thermal interfaces 22, 24 such that they may each be removed from housing 12 without leaving portions of thermally conductive material within housing 12 may be useful, e.g., for purposes of accessing electrical components 32 (FIG. 3) of PCBA 20. After assembly of data storage assembly 10, it may be useful to periodically access electrical components 32 in order to repair data storage assembly 10 or otherwise rework electrical components 32. Thermal interfaces 22, 24 that are removable from data storage assembly 10 without substantially adversely affecting the properties of PCBA 20 provides a cost-effective technique for aiding the conduction of heat away from PCBA 20. In some examples, thermal interfaces 22, 24 may be reused after being removed from housing 12 (e.g., may be replaced in housing 12).

Thermal interfaces 22, 24 may have any suitable thickness. In some examples, thermal interface layers 22, 24 each have a thickness of about 0.1 millimeters (mm) to about 2.0 mm. However, other thicknesses are contemplated and may depend on the dimensions of the particular data storage assembly 10. As described below, in some examples, a thickness of each of thermal interface layers 22, 24 may be selected to fill a space between covers 16, 18 and PCBA 20 within housing 12.

When data storage assembly 10 is assembled, there may be an air gap between covers 16, 18 and PCBA 20. This air gap may act as a thermal insulator that precludes conduction of heat away electrical components 32 (FIG. 3). As a result, heat generated by components 32 may be retained within housing 12. In examples in which thermal interfaces 22, 24 are sized to fill a space between covers 16, 18, respectively, and PCBA 20, thermal interfaces 22, 24 eliminate the air gaps between covers 16, 18 and PCBA 20. Thus, by contacting both covers 16, 18 and PCBA 20, thermal interfaces 22, 24 each provide a relatively low resistance thermal conduction path from PCBA 20, a source of heat, and the exterior of housing 12 (through covers 16, 18), to which the heat may be dissipated. In this way, data storage assembly 10 is configured such that heat can be dissipated through a relatively low resistance thermal pathway including thermal interface material 22, 24, thereby reducing the operating temperatures within housing 12.

The inclusion of thermal interfaces 22, 24 in housing 12 may increase the number of potential uses of data storage assembly 10 and/or decrease the restrictions on the operating environment requirements for data storage assembly 10. For example, the increased ability of data storage assembly 10 to conduct heat away from electrical components 32 may help decrease the cooling requirements for the applications in which data storage assembly 10 is used. Depending on the application in which data storage assembly 10 is used (e.g., within a device or a server room), an external cooling source (e.g., a fan or an air conditioning unit) may be used to help maintain a desirable operating temperature for data storage assembly 10. The increased ability of data storage assembly 10 to conduct heat away from electrical components 32 may help increase the tolerable operating temperature for data storage assembly 10, which may decrease the cooling requirements for data storage assembly 10.

In addition to conducting heat away from electrical components 32 of printed circuit board assembly 20, thermal interfaces 22, 24 may help increase the mechanical robustness of data storage assembly 10. Due to the configuration and placement of thermal interfaces 22, 24 within housing 12, thermal interfaces 22, 24 help protect PCBA 20 from damage due to the application of a transient or cumulative mechanical load on housing 12. In this way, thermal interfaces 22, 24 may also be referred to as a shock protector of PCBA 20. As described in further detail below, thermal interfaces 22, 24 help increase the stiffness of data storage assembly 10, as well as limit the movement of electrical components 32 (FIG. 3) relative to printed circuit board 30 (FIG. 3) of PCBA 20.

Although solid state data storage assembly 10 can exhibit an increased mechanical robustness compared to disc drives or other data storage devices with moving parts, solid state data storage assembly 10 may still be sensitive to applied mechanical loads. Mechanical loads may be exerted on housing 12 of data storage assembly 10, e.g., when data storage assembly 10 is dropped or when an external force is applied to housing 12. Printed circuit board 30 may flex or bend (e.g., from a planar configuration to a nonplanar configuration) when a shock or another type of mechanical load is applied to housing 12. The bending or flexing of printed circuit board 30 may generate shear stresses that disrupt the mechanical joints between electrical components 32 and printed circuit board 30. For example, if solder joints 34 (FIG. 3) are positioned between electrical components 32 and printed circuit board 30 (FIG. 3), the bending or flexing of printed circuit board 30 may result in the deformation and shearing of solder joints 34. Some shear forces may have a magnitude sufficient to deform at least some of the solder joints 34 (or other mechanical connections between electrical components 32 and printed circuit board 30) to the point of failure. When the mechanical connections between electrical components 32 and printed circuit board 30 fail, electrical components 32 may break loose from printed circuit board 30, which disrupts the electrical connection between electrical components 32 and printed circuit board 30, and compromises the ability of data storage assembly 10 to properly operate.

Note that although the illustrative embodiments of FIG. 3 depict the electrical components 32 electrically connected to the printed circuit board 30 by way of external leads the contemplated embodiments are not so limited, in that other types of electrical connections likewise benefit such as but not limited to using ball grid arrays ("BGAs") and the like. Further, although the electrical components 32 are said to be solid state memory components for purposes of an illustrative description the contemplated embodiments are not so limited, in that other types of electrical components likewise benefit such as but not limited to the controller application-specific-integrated-circuit ("ASIC") that performs top level control of the solid state memory components. All the advantageous heat transfer and vibration damping described herein is applicable to the controller ASIC and other electrical components as well, be they connected with external leads or BGAs or the like.

In some examples, thermal interfaces 22, 24 may be configured (e.g., sized and shaped) to help maintain the mechanical and electrical connection between electrical components 32 and printed circuit board 30 of PCBA 20 when a mechanical load is applied to housing 12. In particular, in some examples, thermal interfaces 22, 24 are sized and shaped to contact both PCBA 20 and covers 16, 18, respectively, such that the stiffness of PCBA 20 is effectively increased. Increasing the stiffness of the PCBA can help maintain the integrity of the electrical and mechanical connections (e.g., connector pins or solder joints) between electrical components 32 (FIG. 3) and printed circuit board 30 (FIG. 3) of PCBA 20 by minimizing the stresses that are generated at the electrical and mechanical connections when a mechanical load is applied to housing 12.

In particular, positioning thermal interfaces 22, 24 such as thermal interfaces 22, 24 contacting both PCBA 20 and covers 16, 18, respectively, decreases the possibility that printed circuit board 30 will bend or flex when a mechanical load is applied to data storage assembly 10. The contact between covers 16, 18, thermal interfaces 22, 24, respectively, and printed circuit board 30 creates a composite or layered structure that effectively increases the rigidity of data storage assembly 10 and decreases the amount of available space for circuit board 30 to flex, thereby discouraging the bending or flexing of printed circuit board 30. In this way, the positioning of thermal interfaces 22, 24 in housing 12 increases the stiffness of PCBA 20, thereby minimizing the magnitude of shear stresses that can result in the failure of the mechanical joints between the electrical components and the printed circuit board.

In some examples, thermal interfaces 22, 24 fill the space between PCBA 20 and covers 16, 18, respectively. As a result, when a transient mechanical load is applied to housing 12, thermal interfaces 22, 24 may help hold electrical components 32 in place on printed circuit board 30 by limiting the movement of electrical components 32 relative to printed circuit board 30. This may further help maintain the integrity of the electrical and mechanical connections (e.g., connector pins or solder joints) between electrical components 32 (FIG. 3) and printed circuit board 30 (FIG. 3) of PCBA 20 when a mechanical load is applied to housing 12.

In addition, in some examples, thermal interfaces 22, 24 help distribute a force that is applied to housing 12 across PCBA 20, thereby reducing the concentration of mechanical stress generated within PCBA 20. In this way, distributing the force across at least a part of PCBA 20 may reduce the possibility that the mechanical and electrical joints between electrical components 32 and printed circuit board 30 may break due to the application of external mechanical loads. In some cases, thermal interfaces 22, 24 also dampen the mechanical loads (e.g., shocks) or vibrations that are applied to housing 12 and transmitted to PCBA 20. For example, thermal interfaces 22, 24 may each be formed of a material that has an elastomeric property that enables thermal interfaces 22, 24 to absorb some mechanical loads that are applied to housing 12.

In some examples, thermal interfaces 22, 24 are relatively tacky, such that when thermal interfaces 22, 24 are positioned between PCBA 20 and covers 16, 18, respectively, and, sized to fill the space between covers 16, 18, respectively, and PCBA 20, thermal interfaces 22, 24 adhere to the respective cover 16, 18 and PCBA 20. In some examples, at least one of the thermal interfaces 22, 24 has a peel strength in a range of about 0.44 Newton (about 0.1 pound-force) to about 2.22 Newton (0.5 pound-force) for a 5.08 centimeter (2 inch) by 8.89 centimeter (3.5 inch) sample size relative to PCBA 20. The adhesion between thermal interfaces 22, 24 and the respective cover 16, 18 and PCBA 20 may also help increase the stiffness of data storage assembly 10, which may further improve the shock protection capability of thermal interfaces 22, 24.

In addition, the adhesion between thermal interfaces 22, 24 and the respective cover 16, 18 and PCBA 20 may provide a visible indication that data storage assembly 10 has been tampered with. For example, when thermal interfaces 22, 24 are formed from a relatively tacky material, thermal interfaces 22, 24 may adhere to PCBA 20 and the respective cover 16, 18 when data storage assembly 10 is first assembled. However, the material from which thermal interfaces 22, 24 are formed may not allow thermal interfaces 22, 24 to re-adhere as well (if at all) to the respective cover 16, 18 and PCBA 20 after data storage assembly 10 is disassembled. Thus, if cover 16 and thermal interface 22 are separated from the other components of data storage assembly 10, e.g., to gain access to electrical components 32 of PCBA 20, such tampering with data storage assembly 10 may be evidenced by the lack of adhesion or a decrease in adhesion between thermal interface 22 and PCBA 20. The same visual indication of tampering may also be provided by thermal interface 24 if cover 18 and thermal interface 24 are separated from the other components of data storage assembly 10.

It may be desirable to determine whether the internal components of data storage assembly 10 were exposed, thereby indicating tampering with electrical components 32, for various purposes. For example, the manufacturer of data storage assembly 10 may provide a buyer with a limited warranty (e.g., covering manufacturing defects), which may be nullified if the data storage assembly 10 is tampered with. Prior to performing any warranty repairs on a data storage assembly 10, the manufacturer may determine whether data storage assembly 10 has been tampered with by examining the adhesion between thermal interfaces 22, 24 and covers 16, 18, respectively, and PCBA 20. A diminished adhesion (e.g., compared to an expected adhesion) between one or both of the thermal interfaces and PCBA 20 may indicate that the thermal interface has been removed from housing 12 and subsequently replaced in housing 12.

If thermal interfaces 22, 24 are formed from a substantially conformable material, the manufacturer may also visually inspect thermal interfaces 22, 24 to determine whether the pattern defined by the surface of thermal interfaces 22, 24 facing PCBA 20 substantially matches the expected pattern of a thermal interface 22 that has been first removed from housing 12. If pattern defined by the surface of one or both thermal interfaces 22, 24 differs from the expected pattern, it may indicate that the thermal interface has been removed from housing 12 and subsequently replaced in housing 12, thereby indicating data storage assembly 10 has been tampered with.

Example

An experiment was performed to compare the shock resistance of a solid state drive assembly including a thermally conductive interface material compared to a solid state drive assembly that is otherwise similar, but does not include a thermally conductive interface material. A ½ sine pulse shock was applied to a solid state drive assembly including a housing similar to housing 12 shown in FIGS. 1 and 2 and a PCBA including a plurality of electrical components soldered to a printed circuit board. In particular, a solid state drive assembly was dropped using a Lansmont Drop Tester (made available by Lansmont Corporation of Monterey, Calif.), which helped maintain the desired orientation of the solid state drive assembly as it was dropped. The acceleration at which the drive assemblies were dropped was determined using Model 352A25 and Model 352C22 accelerometers (made available by PCB Piezotronics, Inc. of Depew, N.Y.).

A plurality of solid state drive assemblies each having a different printed circuit board thickness and excluding a thermal interface material were dropped in various orientations. Table 1 illustrates the accelerations with which the solid state drive assemblies were dropped, the thickness of the printed circuit board of the solid state drive assembly, and a duration of each of the drops.

TABLE 1

| Iteration | Z-axis Acceleration (G) | Y-axis Acceleration (G) | X-axis Acceleration (G) | Duration of Load Application | Pass/Fail | Orientation | Printed Circuit Board Thickness |
|---|---|---|---|---|---|---|---|
| 1 | 1500 G | 0 | 0 | 0.52 ms | Pass | Memory Array Up | 0.76 mm |
| 2 | 1500 G | 0 | 0 | 0.52 ms | Pass | Memory Array Up | 0.76 mm |
| 3 | 1567 G | 0 | 0 | 0.52 ms | Fail | Memory Array Up | 0.76 mm |
| 4 | 1508 G | 0 | 0 | 0.52 ms | Pass | Memory Array Up | 0.94 mm |
| 5 | 0 | 1537 G | 0 | 0.51 ms | Pass | I/O Connector down | 0.94 mm |
| 6 | 0 | 0 | 1584 G | 0.51 ms | Pass | Four pin Connector Up | 0.94 mm |
| 7 | 0 | 0 | −1332 G | 0.52 ms | Pass | Four pin Connector Down | 0.94 mm |
| 8 | 0 | −1523 G | 0 | 0.50 ms | Pass | I/O Connector Up | 0.94 mm |
| 9 | −1534 G | 0 | 0 | 0.52 ms | Fail | Memory Array Down | 0.94 mm |
| 10 | 1521 G | 0 | 0 | 0.50 ms | Pass | Memory Array Up | 1.20 mm |
| 11 | 0 | 1618 G | 0 | 0.48 ms | Pass | I/O Connector down | 1.20 mm |
| 12 | 0 | 0 | 1385 G | 0.48 ms | Pass | Four pin Connector Up | 1.20 mm |
| 13 | 0 | 0 | −1449 G | 0.47 ms | Pass | Four pin Connector Down | 1.20 mm |
| 14 | 0 | −1440 G | 0 | 0.48 ms | Pass | I/O Connector Up | 1.20 mm |
| 15 | −1514 G | 0 | 0 | 0.50 ms | Fail | Memory Array Down | 1.20 mm |

In each of the iterations, the solid state drive assembly was dropped with the solid state drive assembly oriented such that the electrical components were facing in either a positive z-axis direction ("memory array up") or a negative-z-axis direction ("memory array down"), such that the input-output (I/O) connector of the solid state drive assembly was face down (e.g., electrical components facing in positive y-axis direction) or face up (e.g., electrical components facing in negative y-axis direction), or such that a four pin connector of the solid state drive assembly was face up (e.g., electrical components facing in positive x-axis direction) or face down (e.g., electrical components facing in negative x-axis direction). In each of the solid state drive assemblies that were dropped, the four pin connector and the I/O connector are positioned on opposite sides of a housing of the solid state drive assembly.

Iterations 1-3 shown in Table 1 represent the dropping of three solid state drive assemblies each having a printed circuit board thickness of about 0.76 millimeters (mm). Iterations 4-9 shown in Table 1 represent the dropping of a single solid state drive assembly having a printed circuit board thickness of about 0.94 mm. In each subsequent drop for iterations 4-9, the solid state drive assembly was rotated, such that the consequences of dropping the solid state drive assembly in each of a plurality of orientations was determined. Iterations 10-15 shown in Table 1 represent the dropping of a single solid state drive assembly having a printed circuit board thickness of about 1.20 mm. In each subsequent drop for iterations 10-15, the solid state drive assembly was rotated, such that the consequences of dropping the solid state drive assembly in each of a plurality of orientations was determined.

A solid state drive assembly was considered to fail the shock test if, upon visual inspection, any of the electrical components were loose or had fallen off the printed circuit board of the solid state drive assembly. As Table 1 demonstrates at least some of the solid state drive assemblies that did not include a thermal interface material were unable to withstand the applied shock. In particular, the solid state drive assemblies showed a sensitivity to accelerations in a negative z-axis direction.

A solid state drive assembly similar in configuration to those tested to generate the data shown in Table 1 was modified to include a thermal interface material between the covers of the housing and the PCBA. The thermal interface material was Bergquist Gap Pad 2202, which is available from Bergquist Company of Chanhassen, Minn., and was selected to have a thickness of about 0.051 mm (about 0.020 inches) to fill the space between the covers of the housing and the PCBA. The solid state drive assembly including a thermal interface material was dropped five times using the Lansmont Drop Tester to determine whether the thermal interface material helped improve the ability of the solid state drive assembly to withstand a shock applied to the outer housing.

Table 2 illustrates the various accelerations with which the solid state drive assembly was dropped, as well as the thickness the printed circuit board and a duration of the drop. As with the testing performed to generate the data shown in Table 1, the solid state drive assembly was considered to fail the shock test if, upon visual inspection, any of the electrical components (e.g., memory chips) were loose or had fallen off the printed circuit board of the solid state drive assembly.

TABLE 2

| Iteration | Z-axis Acceleration (G) | Y-axis Acceleration (G) | X-axis Acceleration (G) | Duration of Load Application | Pass/Fail | Orientation | Printed Circuit Board Thickness |
|---|---|---|---|---|---|---|---|
| 1 | −1513 G | 0 | 0 | 0.52 ms | Pass | Memory Array Up | 1.20 mm |
| 2 | −1637 G | 0 | 0 | 0.52 ms | Pass | Memory Array Up | 1.20 mm |
| 3 | −1765 G | 0 | 0 | 0.52 ms | Pass | Memory Array Up | 1.20 mm |
| 4 | −1867 G | 0 | 0 | 0.52 ms | Pass | Memory Array Up | 1.20 mm |
| 5 | −1957 G | 0 | 0 | 0.52 ms | Pass | Memory Array Up | 1.20 mm |

As Table 2 demonstrates, the solid state drive assembly including a thermal interface material positioned between the covers of the housing and the printed circuit board assembly was able to withstand accelerations up to 1957 G when the solid state drive assembly was dropped with the electrical components (e.g., the memory array) facing in a positive z-axis direction. This suggests that the thermal interface material improves the shock protection of a solid state drive assembly, and, in particular, the electrical components of a PCBA.

Figure 4:
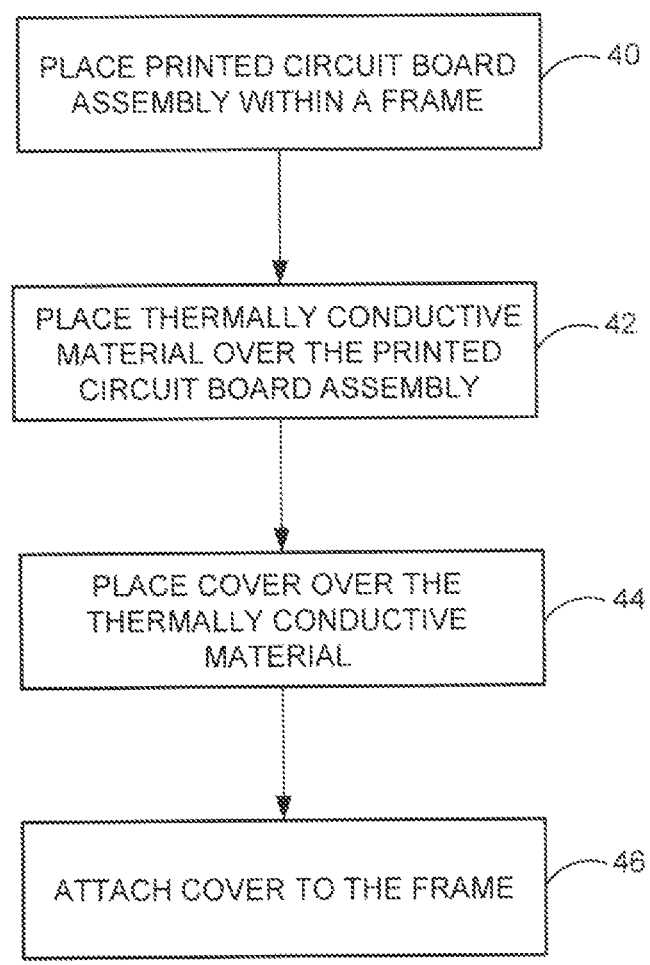
FIG. 4 is a flow diagram of an example technique for forming the solid state data storage assembly of FIG. 2.

FIG. 4 is a flow diagram of an example technique for forming solid state data storage assembly 10. In accordance with the technique shown in FIG. 4, one or more PCBAs 20 are placed within frame 14 (40). The one or more PCBAs 20 can be attached to frame 14 using any suitable technique. In some examples, frame 14 includes side rails, brackets or other mechanical structures that align with and support the one or more PCBAs 20. The one or more PCBAs 20 can be mechanically connected to these side rails, brackets or other mechanical structures of frame 14. For example, the one or more PCBAs can be connected to frame 14 using one or more screws, connection fingers, locking/clipping structures, adhesives, rivets, other mechanical fasteners, welding (e.g., ultrasonic welding) or combinations thereof.

After placing one or more PCBAs 20 within frame 14, thermally conductive material defining thermal interface 22 is placed over PCBA 20 (42). In some examples, the thermally conductive material is placed over PCBA 20 such that the major surface of PCBA 20 that is exposed by frame 14 is substantially covered by the thermally conductive material. In this way, thermal interface 22 may be sized and shaped to substantially cover PCBA 20. After the thermally conductive material is placed over PCBA 20 to define thermal interface 22 (42), cover 16 is positioned over thermal interface 22 (44) and attached to frame 14 (46). Cover 16 can be attached to frame 14 using any suitable technique, such as screws, connection fingers, locking/clipping structures, adhesives, rivets, other mechanical fasteners, welding (e.g., ultrasonic welding) or combinations thereof.

Thermally conductive material can be pre-attached to cover 16 or can separate from cover 16 prior to inclusion in housing 12. In some examples, thermal interface 22 has a thickness that is greater than or equal to a distance between cover 16 and PCBA 20. As a result, when cover 16 is positioned over thermal interface 22 (44) and attached to frame 14 (46), thermal interface 22 substantially fills the space between cover 16 and PCBA 20. In addition, in examples in which thermal interface 22 has a thickness that is greater than a distance between cover 16 and PCBA 20, the attachment of cover 16 to frame 14 compresses thermally interface 22, which may further increase the stiffness of data storage assembly 10. As discussed above, this may help reduce the possibility that printed circuit board 30 (FIG. 3) bends or flexes in the z-axis direction, which can help maintain the integrity of the mechanical and electrical connection between electrical components 32 (FIG. 3) and printed circuit board 30.

In some examples of data storage assembly 10, housing 12 may include a single cover. In other examples, however, housing 12 of data storage assembly 10 includes two covers (e.g., as shown in FIG. 1) or more than two covers. Thus, in some examples of the technique shown in FIG. 4, a thermal conductive material may also be placed over the opposite surface of PCBA 20 to define second thermal interface 24, and second cover 18 may subsequently be positioned over second thermal interface 24 and attached to frame 14.

Figure 5:
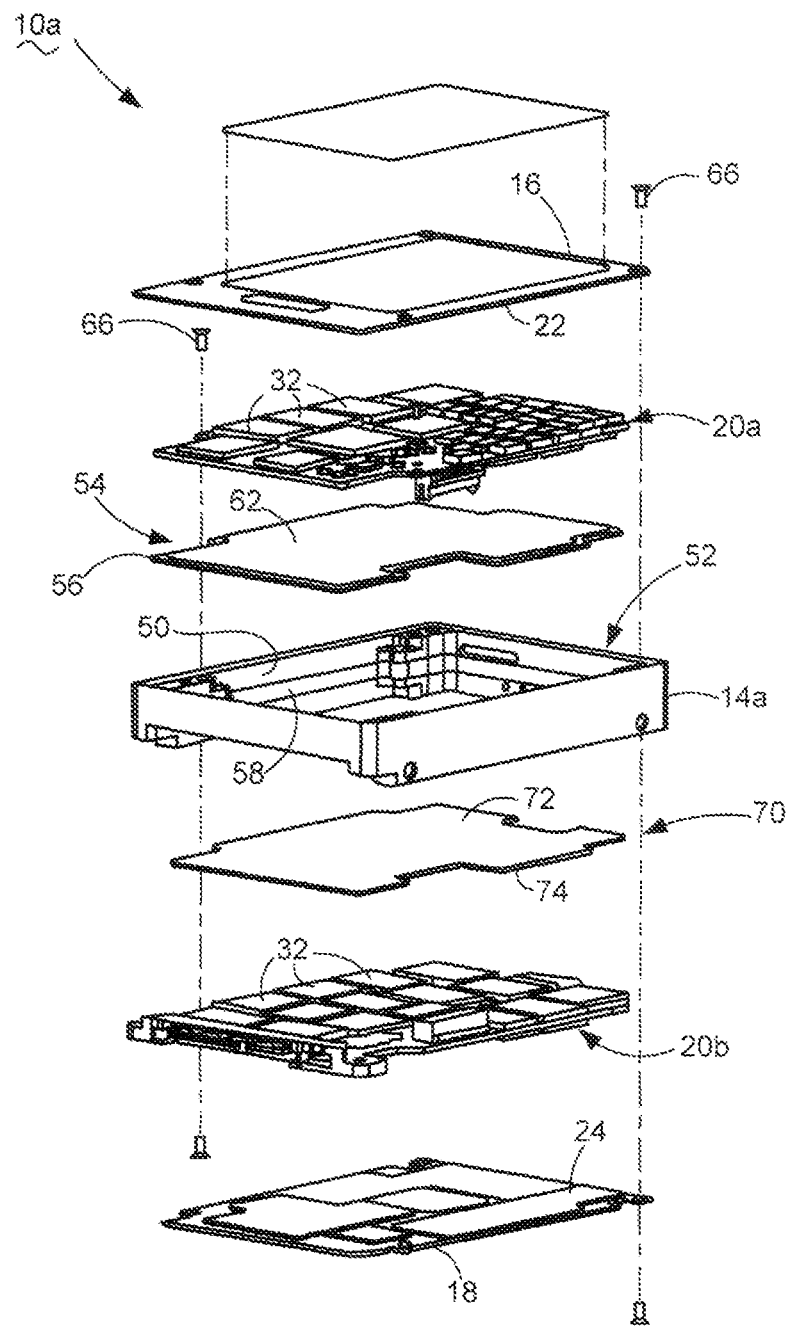
FIG. 5 is an exploded perspective depiction of the solid state data storage assembly of FIG. 1 constructed in accordance with embodiments of the present invention.

There being "more than two covers" generally contemplates embodiments in which there can be one or more internal cover(s) in addition to the two external covers 16, 18 discussed above. Also as previously discussed, some embodiments contemplate the data storage assembly having a plurality of PCBAs in the same enclosure. FIG. 5 is an exploded perspective depiction of illustrative embodiments in which the frame 14a has a perimeter surface 50 defining a passage 52 into which two PCBAs 20a, 20b can fit. As discussed previously, each of the PCBAs 20a, 20b has a plurality of solid state memory components ("components") 32, as well as other electronic components, operably generating heat that is necessarily controlled in accordance with embodiments of this invention. As described above, the thermal interface 22 contactingly engages and thereby conducts heat away from the components 32 during their operation. That is, the thermal interface 22 conducts the heat to the cover 16 which sheds the heat load by convection, such as can be enhanced by a directed airflow over the data storage assembly enclosure.

However, heat can build up in the space inside the enclosure on the other side of the PCBA 20a, especially where components 32 are mounted on that opposing side of the PCBA 20a. The data storage assembly 10a is incapable of conductively shedding heat from the components 32 on the opposing side of the PCBA 20a; it is a dead air space. Clarifying, for purposes of this description and meaning of the appended claims the term "dead air space" is an area inside the enclosure where there is no conductive heat transfer path from the components 32 to the enclosure. The components 32 are attached to the printed circuit board 30 which might, in turn, be in contact with the enclosure. However, the printed circuit board 30 is not a thermally conductive structure and as such does not provide a conductive heat transfer path as that term is meant in accordance with these embodiments. The heat load in the dead air space is exacerbated when both of the sides of the PCBAs 20a, 20b forming the dead air space have mounted components 32 that operably generate heat.

To transfer heat out of the dead air space an internal cover 54 is disposed within the passage 52 on the opposing side of the PCBA 20a from the external cover 16. It will be noted that here the internal cover 54 and the external cover 16 are substantially parallel to each other, and that they cooperate with the frame 14a to enclose the PCBA 20a. The internal cover 54 is constructed of a rigid layer 56 that is thermally conductive, such as made of steel or aluminum and the like. In these illustrative embodiments the rigid layer 56 is connected in direct contact with the frame 14a, and for that reason the frame 14a is likewise constructed of a thermally conductive material such as aluminum or steel and the like.

Figure 6:
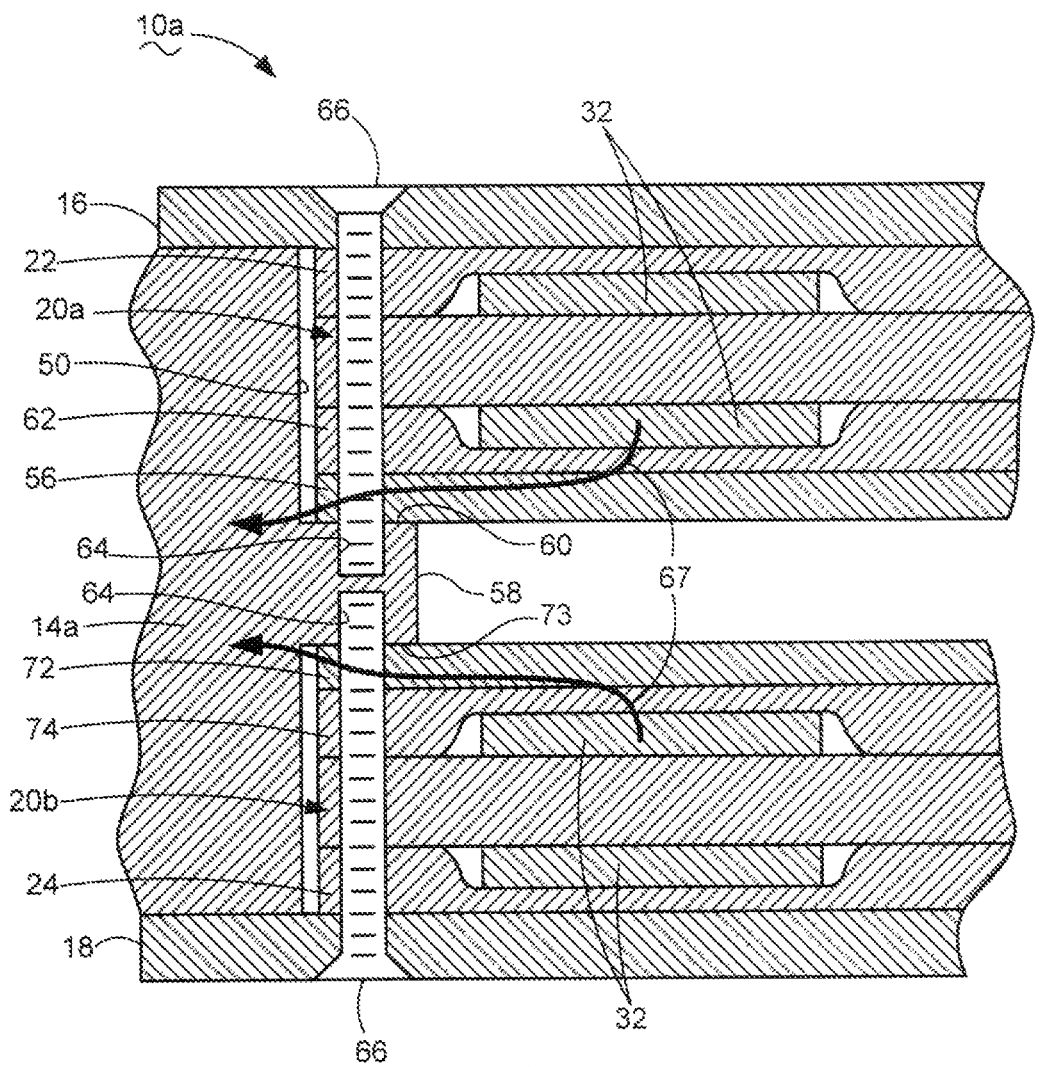
FIG. 6 is a cross-sectional depiction of a portion of the solid state data storage assembly of FIG. 5.

FIG. 6 is a partial cross-sectional depiction of the data transfer assembly 10a depicting the frame 14a defining a protuberant rail 58 extending from the peripheral surface 50. The protuberant rail 58 includes an upper (as depicted here) surface 60 upon which the rigid layer 56 is supported. A compressible conductive layer 62, such as used in constructing the thermal interfaces 22, 24, is compressingly sandwiched between the rigid layer 56 and the PCBA 20a. For example, without limitation, the compressible conductive layer 62 can be adhered or otherwise joined to the rigid layer 56, or the compressible conductive layer 62 can be stacked onto the rigid layer 56. An attachment feature 64 in the rail 58, such as the depicted threaded bore, can be sized to receivingly engage a fastener 66 that attaches both the external cover 16 and the internal cover 54, as well as the sandwiched compressible members 62, 22, respectively, to the frame 14a. The contacting engagement of the compressible conductive layer 62 creates a thermally conductive path for conducting heat from the component 32 to the rigid layer 56. The contacting engagement of the rigid layer 56 against the protuberant rail 58 extends that thermally conductive path for conducting heat to the external surface of the rail 14a where the heat can be shed by convection to the surrounding environment. The entire path for conducting heat from the component 32 is depicted by the enlarged arrow 67.

In the same way in these embodiments another internal cover 70 (FIG. 5) is parallel to the external cover 18 on opposing sides of the PCBA 20b, such that the covers 70, 18 and the frame 14a enclose the PCBA 20b. The internal cover 70 has a rigid layer 72 constructed like the rigid layer 56. A surface 73 of the protuberant rail 58 provides a lower (as depicted here) surface against which the rigid layer 72 is supported. The gap between the rigid layers 56, 72, as defined by the height (as depicted here) of the protuberant rail 58, can be sized as appropriate for clearance purposes of the overall assembly such as to provide space for one or more electrical connectors joining the PCBAs 20a, 20b together.

A compressible conductive layer 74, like the compressible conductive layer 62, is compressingly sandwiched between the rigid layer 72 and the PCBA 20b. As before, the compressible conductive layer 74 can be adhered or otherwise joined to the rigid layer 72, or the compressible conductive layer 74 can be stacked onto the rigid layer 72. Another attachment feature 64, such as the depicted threaded bore, can be sized to receivingly engage a fastener 66 that attaches both the external cover 18 and the internal cover 70, as well as the sandwiched compressible members 74, 24, respectively, to the frame 14a. The contacting engagement of the compressible conductive layer 74 creates a thermally conductive path for conducting heat from the component 32 to the rigid layer 72. The contacting engagement of the rigid layer 72 against the protuberant rail 58 extends that thermally conductive path for conducting heat to the external surface of the rail 14a where the heat can be shed by convection to the surrounding environment. The entire path for conducting heat from the component 32 is depicted by the enlarged arrow 67.

Figure 7:
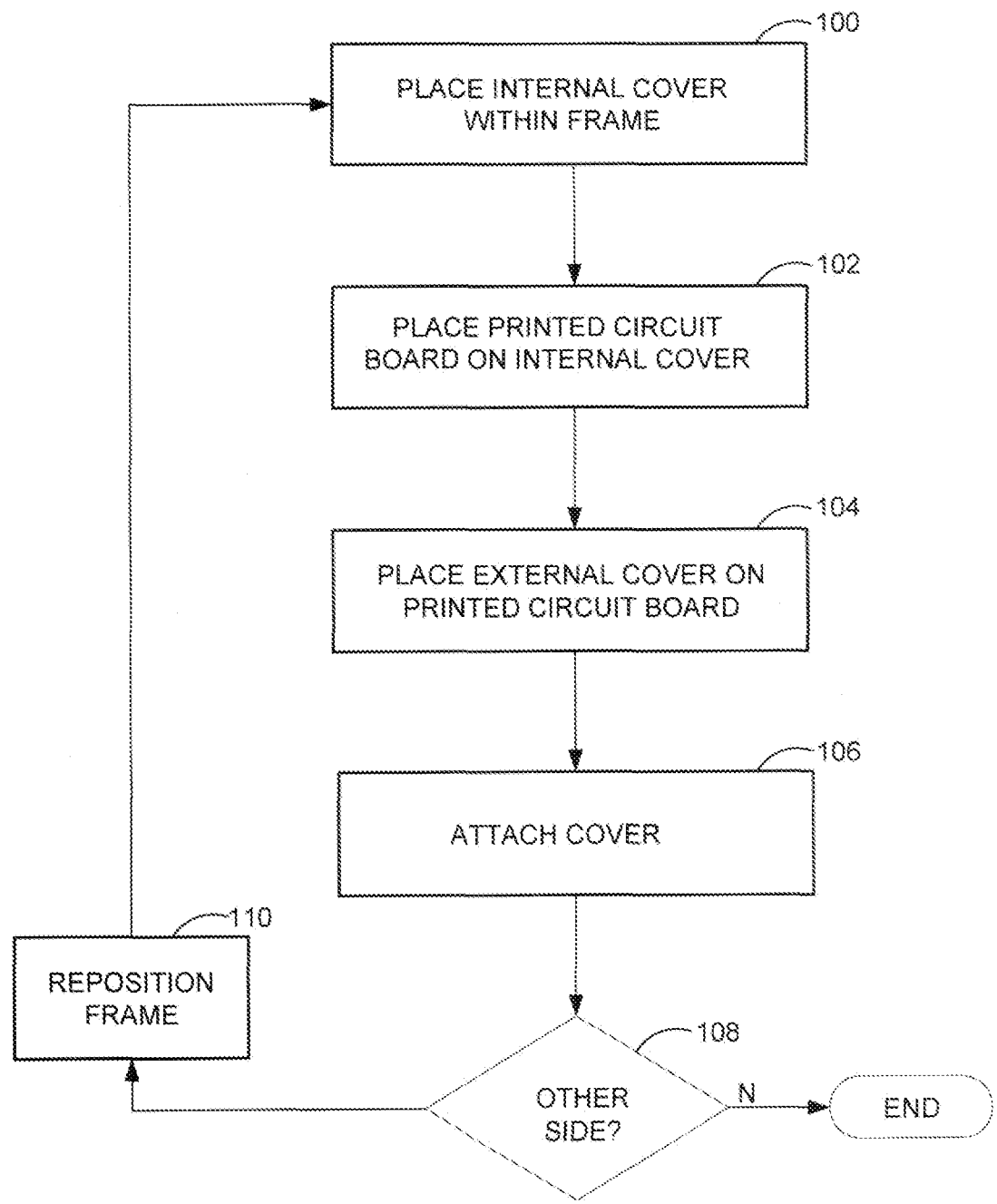
FIG. 7 is a flow diagram of an example technique for forming the solid state data storage assembly of FIG. 5.

The protuberant rail 58 and open passage 52 arrangement advantageously simplifies the manufacturing methodology employed to assemble the data storage assembly 10a. FIG. 7 is a flow diagram of an illustrative technique for forming the solid state data storage assembly 10a. In these embodiments the frame 14a is suitably supported, such as in an assembly fixture and the like, such that the internal cover 54 is positioned within the passage 52 and supported upon the rail 58 (100). The frame 14a can advantageously be positioned horizontally in order that gravity can assist in positioning the internal cover 54 on the rail 58. From the above description it is noted that the internal cover 54 can include both the rigid layer 56 and the compressible conductive layer 62, so either the layers 56, 62 are positioned as a unitary assembly or they are positioned individually and in order (100). The PCBA 20a is then positioned within the passage 52 upon the internal cover 54 (102). The external cover 16 is then positioned against the frame 14a (104). In embodiments where the compressible thermal interface 22 is included then the layers 16, 22 are either positioned as a unitary assembly or the layers 16, 22 are positioned individually and in order. A plurality of fasteners 66 are then coupled at distal ends thereof to the respective attachment features 64 in the rail 58 to attach both covers 54, 16 and the PCBA 20a to the rail 58, and to also compressingly sandwich the thermal interface materials 62, 22 therebetween (106).

With the top (as depicted) half assembled a determination is then made as to whether the other side needs to be assembled (108). If the determination is "no," then the technique ends. Otherwise, if the determination is "yes," then optionally the frame 14a can be repositioned to facilitate the further assembly operations (110). For example, if the frame 14a is positioned horizontally during the assembly above for the advantage of using gravity to assist in positioning the components of assembly, then the frame 14a can be rotated 180 degrees so that it is presented in the same advantageous position for assembling the rest of the components of assembly.

In any event, control returns to the beginning of the technique such that the internal cover 70 is positioned within the passage 52 and supported upon the rail 58 (100). Again, from the above description it is noted that the internal cover 70 can include both the rigid layer 72 and the compressible conductive layer 74, so either the layers 72, 74 are positioned as a unitary assembly or they are positioned individually and in order (100). The PCBA 20b is then positioned within the passage 52 upon the internal cover 70 (102). The external cover 18 is then positioned against the frame 14a (104). In embodiments where the compressible thermal interface 24 is included then the layers 18, 24 are either positioned as a unitary assembly or the layers 18, 24 are positioned individually and in order. A plurality of fasteners 66 are then coupled at distal ends thereof to the respective attachment features 64 in the rail 58 to attach both covers 70, 18 and the PCBA 20b to the rail 58, and to also compressingly sandwich the thermal interface materials 74, 24 therebetween (106).

Figure 8:
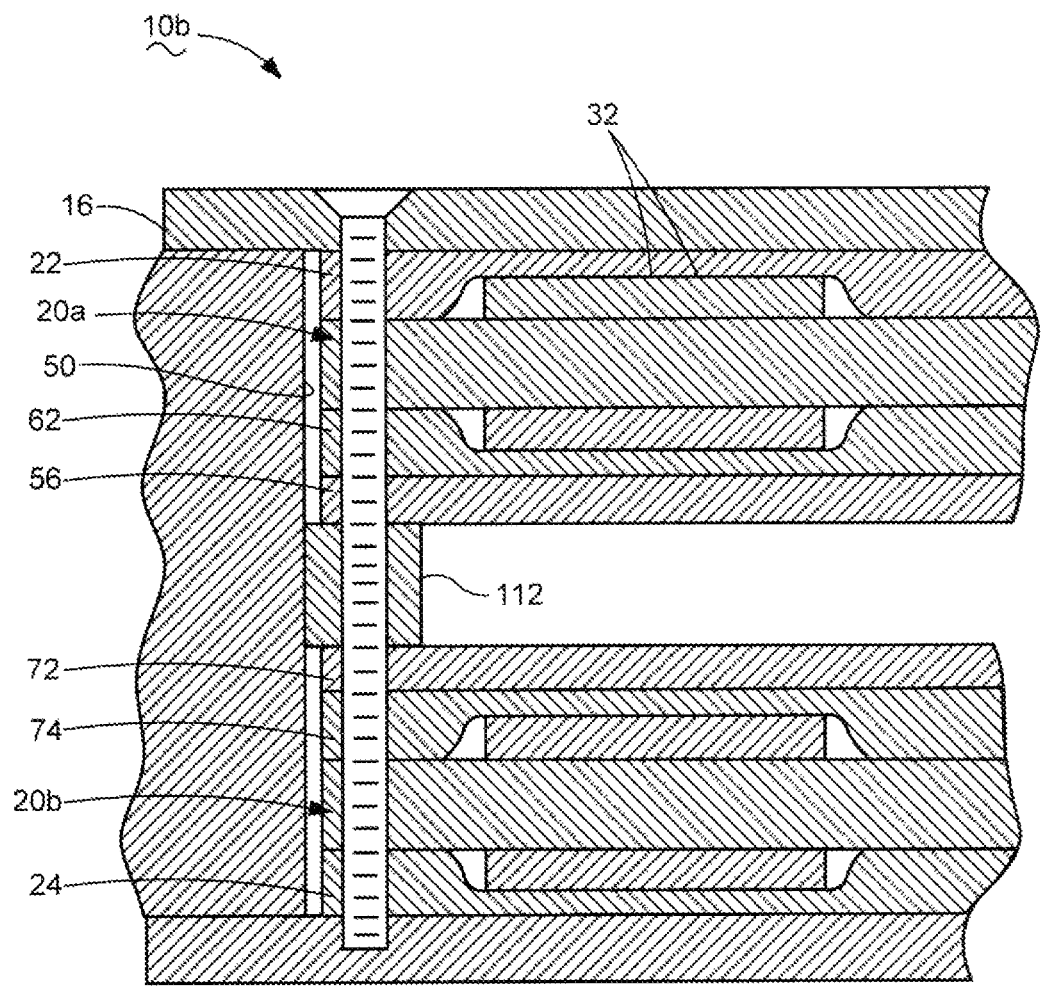
FIG. 8 is a cross-sectional depiction similar to FIG. 6 but depicting the solid state data storage assembly constructed in accordance with alternative embodiments of the present invention.

All of the foregoing embodiments employing internal covers 54, 70 are used in an enclosure that is constructed of two external covers 16, 18, although the contemplated embodiments are not so limited. FIG. 8, for example, depicts illustrative alternative embodiments of a data storage assembly 10b that employs the two internal covers 54, 70 as above, but only employs one external cover 16. Instead of the other external cover 18 as described above, these depicted embodiments employ a unitary closed-bottom frame 14b with the components of assembly described above assembled in the same arrangement but from bottom-up. Here, instead of the protuberant rail 58 extending from the peripheral surface 50, a spacer 112 is positioned within the passage 52 upon the rigid layer 72 of the internal cover 70. The rigid layer 56 of the internal cover 54 is then positioned upon the spacer 112, and on as in the same manner as upon the rail 58 described above.

Generally, the embodiments of the present invention contemplate a data storage device having an enclosure constructed of opposing external sides (such as the external covers 16, 18) that are spatially separated by a peripheral edge (such as frame 14) defining a cavity. A PCBA (such as 20) is mounted in the cavity substantially parallel to the external sides and defining the dead air space in the cavity between the PCBA and at least one of the external sides. A means is provided for conducting heat from the dead air space to the peripheral edge of the enclosure. For purposes of this description and meaning of the claims, the term "means for conducting heat" encompasses the disclosed structure and structural equivalents thereof that are capable of conducting heat from the dead air space to the peripheral edge of the enclosure. For example, the disclosed structure includes the components and arrangement constructing the conductive path 67 from the component 32 to the outer edge of the frame 14a as depicted in FIG. 6; the compressible conductive layer 62 compressingly engaged against the component 32, the rigid layer 56 contactingly engaging the compressible conductive layer 62 and, in turn, compressingly engaging the protuberant rail 58 portion of the frame 14a.

It is to be understood that even though numerous characteristics and advantages of various embodiments of the present invention have been set forth in the foregoing description, together with the details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, any single or multiple pluralities of the PCBAs and various arrangements for mounting the PCBAs are contemplated while still maintaining substantially the same functionality without departing from the scope and spirit of the claimed invention. Further, although the preferred embodiments described herein are directed to data storage drives, and related technology, it will be appreciated by those skilled in the art that the claimed invention can be applied to other devices employing heat generating components, without departing from the spirit and scope of the present invention.

What is claimed is:

1. An apparatus comprising:
   a thermally conductive frame having a perimeter surface defining a passage;
   a printed circuit board assembly (PCBA) operably disposed within the passage, the PCBA including a solid state memory component;
   an internal cover in the passage on one side of the PCBA, the internal cover conducting heat to the frame that is operably generated by the solid state memory component; and
   an external cover attachable to the frame on an opposing side of the PCBA and cooperating with the frame and the internal cover to enclose the PCBA.

2. The apparatus of claim 1 wherein the internal cover and the external cover are operably substantially parallel to the PCBA.

3. The apparatus of claim 1 wherein the internal cover comprises a rigid conductive layer operably contacting the frame and a compressible conductive layer operably compressingly sandwiched between the rigid conductive layer and the solid state memory component.

4. The apparatus of claim 3 wherein the frame defines a protuberant rail extending from the peripheral surface and operably supporting the rigid conductive layer.

5. The apparatus of claim 4 wherein the rail defines an attachment feature sized to receivingly engage a fastener that operably attaches the external cover and the rigid conductive layer of the internal cover to the rail.

6. The apparatus of claim 3 wherein the rigid conductive layer is characterized as a first rigid conductive layer and the compressible conductive layer is characterized as a first compressible conductive layer, the external cover comprising a second rigid conductive layer and a second compressible conductive layer operably compressingly sandwiched between the second rigid conductive layer and the PCBA.

7. The apparatus of claim 5 wherein the PCBA is characterized as a first PCBA and the solid state memory component is characterized as a first solid state memory component, comprising:
   a second PCBA operably disposed within the passage, the second PCBA including a second solid state memory component; and
   a second internal cover in the passage on one side of the second PCBA, the second internal cover conducting heat to the frame that is operably generated by the second solid state memory component.

8. The apparatus of claim 7 wherein the external cover is characterized as a first external cover, comprising a second external cover on an opposing side of the second PCBA cooperating with the frame and the second internal cover to enclose the second PCBA.

9. The apparatus of claim 8 wherein the second internal cover and the second external cover are operably substantially parallel to the second PCBA.

10. The apparatus of claim 7 wherein the second internal cover comprises a third rigid conductive layer operably contacting the frame and a third compressible conductive layer operably compressingly sandwiched between the third rigid conductive layer and the second solid state memory component.

11. The apparatus of claim 10 wherein the rail operably supports the third rigid conductive layer.

12. The apparatus of claim 8 wherein the attachment feature is characterized as a first attachment feature and the fastener is characterized as a first fastener, the rail defining a second attachment feature sized to receivingly engage a second fastener operably attaching the second external cover and the second internal cover to the rail.

13. The apparatus of claim 8 wherein the second external cover comprises a fourth rigid conductive layer and a fourth compressible conductive layer operably compressingly sandwiched between the fourth rigid conductive layer and the second PCBA.

14. A method comprising:
   obtaining a thermally conductive frame having a perimeter surface defining a passage;
   positioning a conductive internal cover in the passage;
   positioning a PCBA in the passage, the PCBA including a solid state memory component; and
   attaching an external cover to the frame, thereby urging the solid state memory component in contact against a compressible layer of the internal cover and urging a rigid layer of the internal cover in contact against the frame, establishing a conductive path via the internal cover for transferring heat to the frame that is operably generated by the solid state memory component.

15. The method of claim 14 wherein the obtaining a thermally conductive frame is characterized by a protuberant rail extending from the perimeter surface, and the positioning a conductive internal cover is characterized by supporting the rigid layer on the rail.

16. The method of claim 15 wherein the conductive internal cover is characterized as a first conductive internal cover, the PCBA is characterized as a first PCBA, and the solid state memory component is characterized as a first solid state memory component, the method comprising:
   positioning a second conductive internal cover in the passage;
   positioning a second PCBA in the passage, the second PCBA including a second solid state memory component; and
   attaching the second PCBA to the frame, thereby urging the second solid state memory component in contact against a compressible layer of the second internal cover and urging a rigid layer of the second internal cover in contact against the frame, establishing a conductive path for a transfer of heat to the frame that is operably generated by the second solid state memory component.

17. The method of claim 16 wherein the positioning the second internal cover in the passage is characterized by supporting the rigid layer of the second internal cover on the rail.

18. The method of claim 17 wherein the external cover is characterized by a first external cover, and wherein the attaching the second PCBA to the frame comprises attaching a second external cover on the side of the PCBA opposing the second internal cover.

19. The method of claim 18 wherein the obtaining a frame is characterized by the rail defining a plurality of attachment features, comprising engaging a first fastener with one of the attachment features to attach the first external cover, the first PCBA, and the first internal cover to the rail, and further comprising engaging a second fastener with another one of the attachment features to attach the second external cover, the second PCBA, and the second internal cover to the rail.

20. A data storage device comprising:
- an enclosure having opposing external sides spatially separated by a peripheral edge defining a cavity;
- a PCBA mounted in the cavity substantially parallel to the external sides and defining a dead air space in the cavity between the PCBA and at least one of the external sides; and
- means for conducting heat from the dead air space to the peripheral edge of the enclosure.

* * * * *